US005627759A

United States Patent [19]
Bearden et al.

[11] Patent Number: 5,627,759
[45] Date of Patent: May 6, 1997

[54] ELECTRICAL ENERGY METERS HAVING REAL-TIME POWER QUALITY MEASUREMENT AND REPORTING CAPABILITY

[75] Inventors: Michael K. Bearden, Waxhaw; William I. Jenrette, Charlotte, both of N.C.; Bruce E. Randall, Rock Hill, S.C.

[73] Assignee: Process Systems, Inc., Charlotte, N.C.

[21] Appl. No.: 455,477

[22] Filed: May 31, 1995

[51] Int. Cl.$^6$ .................................. G01R 19/165
[52] U.S. Cl. .......................... 364/483; 340/661
[58] Field of Search ................. 324/103 R, 103 P, 324/142; 340/661; 364/464.04, 483, 492

[56] References Cited

U.S. PATENT DOCUMENTS

| | | | |
|---|---|---|---|
| 2,039,863 | 5/1936 | Williams | 324/103 R |
| 2,079,064 | 5/1937 | Burrill | 324/771 |
| 4,006,413 | 2/1977 | Silbergerg | 324/103 P |
| 4,156,280 | 5/1979 | Griess | 364/481 |
| 4,295,094 | 10/1981 | Wilreker et al. | 324/96 |
| 4,484,290 | 11/1984 | Bagnall et al. | 364/483 |
| 4,511,979 | 4/1985 | Amirante | 364/464.04 X |
| 4,558,275 | 12/1985 | Borowy et al. | 324/103 P |
| 4,568,934 | 2/1986 | Algood | 364/464.04 X |
| 4,591,988 | 5/1986 | Klima et al. | 364/464.04 |
| 4,604,714 | 8/1986 | Putman et al. | 364/494 |
| 4,644,320 | 2/1987 | Carr et al. | 340/310 A |
| 4,701,698 | 10/1987 | Karlsson et al. | 324/116 |
| 4,713,608 | 12/1987 | Catiller et al. | 324/142 |
| 4,752,697 | 6/1988 | Lyons et al. | 290/2 |
| 4,803,632 | 2/1989 | Frew et al. | 364/464.04 |
| 4,804,957 | 2/1989 | Selph et al. | 340/870.03 |
| 4,805,114 | 2/1989 | Putman et al. | 364/494 |
| 4,806,855 | 2/1989 | Davis | 324/127 |
| 4,855,671 | 8/1989 | Fernandes | 324/127 |
| 4,862,287 | 8/1989 | Paul | 364/483 X |
| 4,870,351 | 9/1989 | Milkovic | 324/142 |
| 4,884,021 | 11/1989 | Hammond et al. | 324/142 |
| 4,884,022 | 11/1989 | Bishop | 324/157 |
| 4,999,569 | 3/1991 | Weikel | 324/74 |
| 5,027,285 | 6/1991 | McCartney et al. | 364/483 |
| 5,038,372 | 8/1991 | Elms et al. | 379/94 |
| 5,081,591 | 1/1992 | Hanway et al. | 364/485 |
| 5,082,369 | 1/1992 | Kennon et al. | 356/243 |
| 5,116,169 | 5/1992 | Loy | 408/39 |

(List continued on next page.)

OTHER PUBLICATIONS

Corti et al., *New Low Cost Technologies For Monitoring Power Quality In Substations And Industrial Sites*, 13th International Conference on Electricity Distribution 1995, Proceedings of CIRED '95, Brussels, Belgium, 8–11 May 1995, vol. 2, pp. 29/1–6, Abstract.

"Power Measurement 3720 ACM," 1994 *Power Measurement Ltd.*, Revision Date: May 31, 1994.

"Power Logic® Circuit Monitor (Series 2000)," *Descriptive Bulletin*, Feb. 1993.

"Metrosonics pa–7 Portable Power Analyzer/Recorder," Systems Service Corporation.

(List continued on next page.)

*Primary Examiner*—Edward R. Cosimano
*Attorney, Agent, or Firm*—Bell, Seltzer, Park & Gibson

[57] ABSTRACT

A revenue accuracy meter and a method are provided for measuring the amount and quality of power received by a power customer across electrical power lines. The revenue accuracy meter preferably has a variation determiner for determining undesired variations in an electrical signal representative of power received by the power customer during a plurality of predetermined time periods. A power usage measurer is coupled in electrical communication with the variation determiner for measuring the power usage of a customer responsive to an electrical signal representative of a customer load. The meter further has a communications interface coupled in electrical communication with the variation determiner and the power usage measurer for communication signals representative of the power variations and the power usage. An energy management controller also preferably is connected to the communications interface for controlling power usage responsive to predetermined electrical command signals received from the power customer through the communications interface.

14 Claims, 14 Drawing Sheets

U.S. PATENT DOCUMENTS

| | | | |
|---|---|---|---|
| 5,159,562 | 10/1992 | Putman et al. | 364/494 |
| 5,173,657 | 12/1992 | Holdsclaw | 324/142 |
| 5,185,591 | 2/1993 | Shuey | 340/310 A |
| 5,193,111 | 3/1993 | Matty et al. | 379/106 |
| 5,245,145 | 9/1993 | Freeman et al. | 200/144 AP |
| 5,247,244 | 9/1993 | Miller et al. | 324/96 |
| 5,256,979 | 10/1993 | Moorman | 324/713 |
| 5,300,924 | 4/1994 | McEachern et al. | 364/483 X |
| 5,301,121 | 4/1994 | Garverick et al. | 364/483 |
| 5,307,009 | 4/1994 | McEachern et al. | 324/142 |
| 5,311,068 | 5/1994 | Miller | 307/112 |
| 5,311,117 | 5/1994 | Komatsu et al. | 324/142 |
| 5,315,235 | 5/1994 | Atherton et al. | 324/116 |
| 5,317,546 | 5/1994 | Balch et al. | 368/9 |
| 5,325,051 | 6/1994 | Germer et al. | 324/142 |
| 5,336,991 | 8/1994 | Atherton et al. | 324/142 |
| 5,455,551 | 10/1995 | Grimes et al. | 336/60 |
| 5,457,621 | 10/1995 | Munday et al. | 363/56 |
| 5,469,365 | 11/1995 | Diekema et al. | 364/464.04 X |
| 5,488,565 | 1/1996 | Kennon et al. | 364/483 |
| 5,495,167 | 2/1996 | Cotroneo | 324/74 |
| 5,514,958 | 5/1996 | Germer | 324/74 |
| 5,525,898 | 6/1996 | Lee, Jr. et al. | 324/142 |
| 5,530,366 | 6/1996 | Nasrallah | 324/547 |
| 5,537,029 | 7/1996 | Hemminger et al. | 324/142 |
| 5,537,333 | 7/1996 | Hemminger et al. | 364/492 |
| 5,544,089 | 8/1996 | Hemminger et al. | 364/492 |
| 5,546,318 | 8/1996 | Lee, Jr. | 364/483 |
| 5,548,527 | 8/1996 | Hemminger et al. | 364/492 |

OTHER PUBLICATIONS

Fulcrum® SQ400 Electronic Multifunction Meter, *Bulletin 11631*, Aug. 1994.

*American National Standard for Electricity Metering Solid–State Electricity Meters*, American National Standards Institute, published by the Institute of Electrical and Electronics Engineers, Inc., Jul. 19, 1991.

*Alternating current static watt–hour meters for active energy* (classes 0,2 S and 0,5 S), CEI/IEC 687: 1992.

Energy Distribution by George G. Karady of Arizona State University, *The Electrical Engineering Handbook*, 1993, pp. 1310–1319.

Energy Management by K. Neil Stanton of ESCA Corporation, Jay C. Giri of ESCA Corporation and Anjan Bose of Arizona State University, *The Electrical Engineering Handbook*, 1993, pp. 1344–1353.

*PSI Energy Monitor*, PSI Energy Systems, Inc., 1992.

*PSI Energy Manager*, PSI Energy Systems, Inc., 1993.

*PSI Energy Analyzer PLUS*, PSI Energy Sytems, Inc., 1993.

*PSI Energy Analyzer System Overview*, PSI Energy Systems, Inc., Dec. 1990.

*PSI Energy Recorder*, PSI Energy Systems, Inc., 1993.

*The PSI Energy Analyzer™ System . . . Software to Manage Your Electricity Costs*, PSI Energy Systems, Inc., 1991.

*PSI Quad 4 Solid State Meter*, Process Systems, Jun. 1 19994.

*PSI Energy Analyzer System*, PSI Energy Systems, Inc., Jul. 1992.

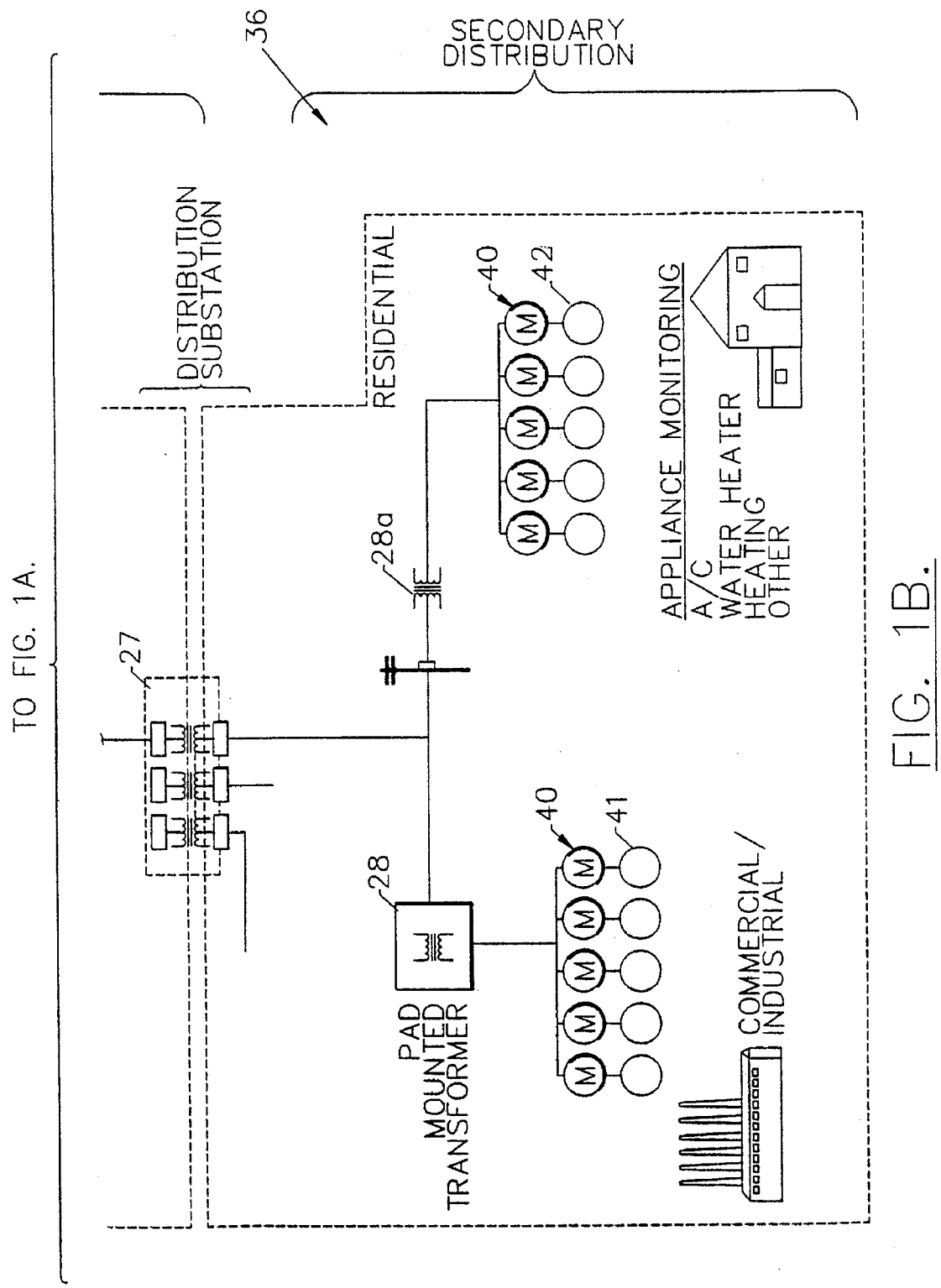

ELECTRICAL ENERGY METERS HAVING REAL-TIME POWER QUALITY MEASUREMENT AND REPORTING CAPABILITY

FIELD OF THE INVENTION

This invention relates to electricity meters such as used by commercial, industrial, or residential customers of power utility companies and, more particularly, to a revenue accuracy meter having various operational capabilities such as power quality measurement and/or energy management.

BACKGROUND OF THE INVENTION

Utility power distribution generally starts with generation of the power by a power generation facility, i.e., power generator or power plant. The power generator supplies power through step-up subtransmission transformers to transmission lines. To reduce power transportation losses, the step-up transformers increase the voltage and reduce the current. The actual transmission line voltage conventionally depends on the distance between the subtransmission transformers and the users or customers. Distribution substation transformers reduce the voltage from transmission line level generally to a range of about 2–35 kilo-volts ("kV"). The primary power distribution system delivers power to distribution transformers that reduce the voltage still further, i.e., about 120 V to 600 V.

For background purposes, and future reference herein, an example of a power utility distribution system as described above and understood by those skilled in the art is illustrated in FIGS. 1A and 1B of the drawings. Power utility companies, and suppliers thereto, have developed systems to analyze and manage power generated and power to be delivered to the transmission lines in the primary power distribution system, e.g., primarily through supervisory control and data acquisition ("SCADA"). These primary power distribution analyzing systems, however, are complex, expensive, and fail to adequately analyze power that is delivered to the industrial, commercial, or residential customer sites through the secondary power distribution system.

Also, various systems and methods of metering power which are known to those skilled in the art are used by commercial, industrial, and residential customers of power utility companies. These power metering systems, however, generally only measure the amount of power used by the customer and record the usage for reading at a later time by the utility power company supplying the power to the customer. A revenue accuracy meter is an example of such a metering system conventionally positioned at a customer site to receive and measure the amount of power consumed by the customer during predetermined time periods during a day.

Conventionally, electric power is delivered to industrial, commercial, and residential customers by local or regional utility companies through the secondary power distribution system to revenue accuracy type electricity meters as an alternating current ("AC") voltage that approximates a sine wave over a time period and normally flows through customer premises as an AC current that also approximates a sine wave over a time period. The term "alternating waveform" generally describes any symmetrical waveform, including square, sawtooth, triangular, and sinusoidal waves, whose polarity varies regularly with time. The term "AC" (i.e., alternating current), however, almost always means that the current is produced from the application of a sinusoidal voltage, i.e., AC voltage.

In an AC power distribution system, the expected frequency of voltage or current, e.g., 50 Hertz ("Hz"), 60 Hz, or 400 Hz, is conventionally referred to as the "fundamental" frequency, regardless of the actual spectral amplitude peak. Integer multiples of this fundamental frequency are usually referred to as harmonic frequencies, and spectral amplitude peaks at frequencies below the fundamental are often referred to as "sub-harmonics," regardless of their ratio relationship to the fundamental.

Various distribution system and environmental factors, however, can distort the fundamental frequency, i.e., harmonic distortion, can cause spikes, surges, or sags, and can cause blackouts, brownouts, or other distribution system problems that greatly affect the quality of power received by the power customer at its facility or residence.

These revenue accuracy metering systems have been developed to provide improved techniques for accurately measuring the amount of power used by the customer so that the customer is charged an appropriate amount and so that the utility company receives appropriate compensation for the power delivered and used by the customer. Examples of such metering systems may be seen in U.S. Pat. No. 5,300,924 by McEachern et al. titled "Harmonic Measuring Instrument For AC Power Systems With A Time-Based Threshold Means" and U.S. Pat. No. 5,307,009 by McEachern et al. titled "Harmonic-Adjusted Watt-Hour Meter."

These conventional revenue accuracy type metering systems, however, have failed to provide information about the quality of the power, i.e., frequency and duration of blackouts, brownouts, harmonic distortions, surges, sags, imbalances, huntings, chronic overvoltages, spikes, transients, line noise, or the like, received by a power customer at a particular customer site. As utility companies become more and more deregulated, these companies will likely be competing more aggressively for various customers, particularly heavy power users, and the quality of the power received by the power customer is likely to be important.

For example, one competitive advantage that some utility companies may have over their competitors could be a higher quality of the power supplied to and received by the customer during certain time periods. One company may promote the fact that it has fewer times during a month that power surges reached the customer causing potential damage to computer systems or the like at the customer site. Another company may promote that it has fewer times during a month when the voltage level delivered to the customer was not within predetermined ranges which may be detrimental to electromagnetic devices such as motors or relays. Previous systems for measuring quality of power in general, however, are expensive, are bulky, require special set up and are not integrated into or with a revenue accuracy meter. Without a revenue accuracy metering system that measures the quality of the power supplied to and received by the customer and a metering system wherein a power generator and/or the power customer has access to this information, however, these comparisons cannot be readily made.

OBJECTS AND SUMMARY OF THE INVENTION

It is therefore an object of the present invention to provide a revenue accuracy meter capable of measuring the quality and amount of power received by a power customer from a power generator such as a utility company.

It is another object of the present invention to provide a revenue accuracy meter capable of providing energy management information and control to a power customer.

It is still another object of the present invention to provide a revenue accuracy meter capable of measuring the quality and amount of power received by a power customer from a power generator such as a utility company and capable of providing energy management information and control to a power customer.

It is yet another object of the present invention to provide a revenue accuracy meter capable of isolating data control functions in a secure manner between a power generator and a power customer so that the power customer is capable of transmitting and receiving data from the revenue accuracy meter separate from the power generator.

It is a further object of the present invention to provide a revenue accuracy meter which provides compatible data communication interaction with a SCADA control center and various utility company groups such as operations, finance, engineering, customer service, and marketing.

The present invention advantageously provides a revenue accuracy meter having the combination of means for determining the quality of the power received by the power customer during predetermined time periods and means for measuring the amount of power used by the customer during predetermined time periods. This information about the quality and amount of power, for example, not only provides competitive information for utility companies and customers thereof, but also provides troubleshooting information for utility companies and customers in areas of power distribution such as through a secondary distribution system. This information can enable a utility company or customer to identify areas or specific sources of power quality problems caused by other users or by other problems in areas such as large industrial equipment causing signal problems.

More particularly, these and other objects of the present invention are provided by a revenue accuracy meter for measuring the amount and quality of power received by a power customer such as across electrical power lines. The meter preferably has a variation determiner preferably for determining undesired variations in an electrical signal representative of power received by a power customer during a plurality of predetermined time periods. A power usage measurer is coupled in electrical communication with the variation determiner for measuring the power usage of a customer responsive to an electrical signal representative of a customer load. The meter further has a communications interface coupled in electrical communication with the variation determiner and the power usage measurer for communication signals representative of the undesired power variations and the power usage.

A revenue accuracy meter of the present invention preferably further includes a plurality of data communication ports and a receiver and a transmitter each respectively positioned for receiving and transmitting data through the plurality of data communication ports. At least one of the plurality of data communication ports preferably is arranged for data communications with a power customer and at least one of the plurality of data communication ports preferably is arranged for data communications with a power generator. An energy management controller preferably is connected to the receiver and the transmitter for controlling power usage responsive to predetermined electrical command signals received from the power customer through the power customer port.

A method of measuring quality of power is also provided according to the present invention. This method preferably includes determining frequency and duration of undesired variations in an electrical signal representative of power received by a power customer across electrical power lines during a plurality of predetermined time periods and communicating a signal representative of the undesired power variations to a power generator. The method preferably further includes measuring power usage of a power customer responsive to an electrical signal representative of a customer load and communicating a signal representative of the amount of power used responsive to a command signal received from a power generator.

By providing power quality and power usage measurement, as well as other beneficial functions such as energy management control, in a revenue accuracy meter, the present invention provides a compact and relatively inexpensive solution to the above-mentioned problems. By providing data communications capabilities with a revenue accuracy meter of the invention, power generators or other third parties also can thereby monitor power quality situations at specific customer sites, i.e., including problems in the secondary power distribution system, remote from the power generating stations or SCADA control facilities. For example, a revenue accuracy meter according to the present invention can provide utility power companies the capability to improve customer service, troubleshoot or diagnose problems, quickly identify emergency situations, and systematically analyze information from specific customer sites.

BRIEF DESCRIPTION OF THE DRAWINGS

Some of the objects and advantages of the present invention having been stated, others will be more fully understood from the detailed description that follows and by reference to the accompanying drawings in which:

FIGS. 1A and 1B schematically illustrate an environmental view of a revenue accuracy meter having power quality measurement according to the present invention;

DETAILED DESCRIPTION

The present invention will now be described more fully hereinafter with reference to the accompanying drawings in which preferred embodiments of the invention are shown. This invention may, however, be embodied in many different forms and should not be construed as limited to the illustrated embodiments set forth herein; rather, these embodiments are provided so that this disclosure will be thorough and complete and will fully convey the scope of the invention to those skilled in the art. Like numbers refer to like elements throughout.

Figure 1A:
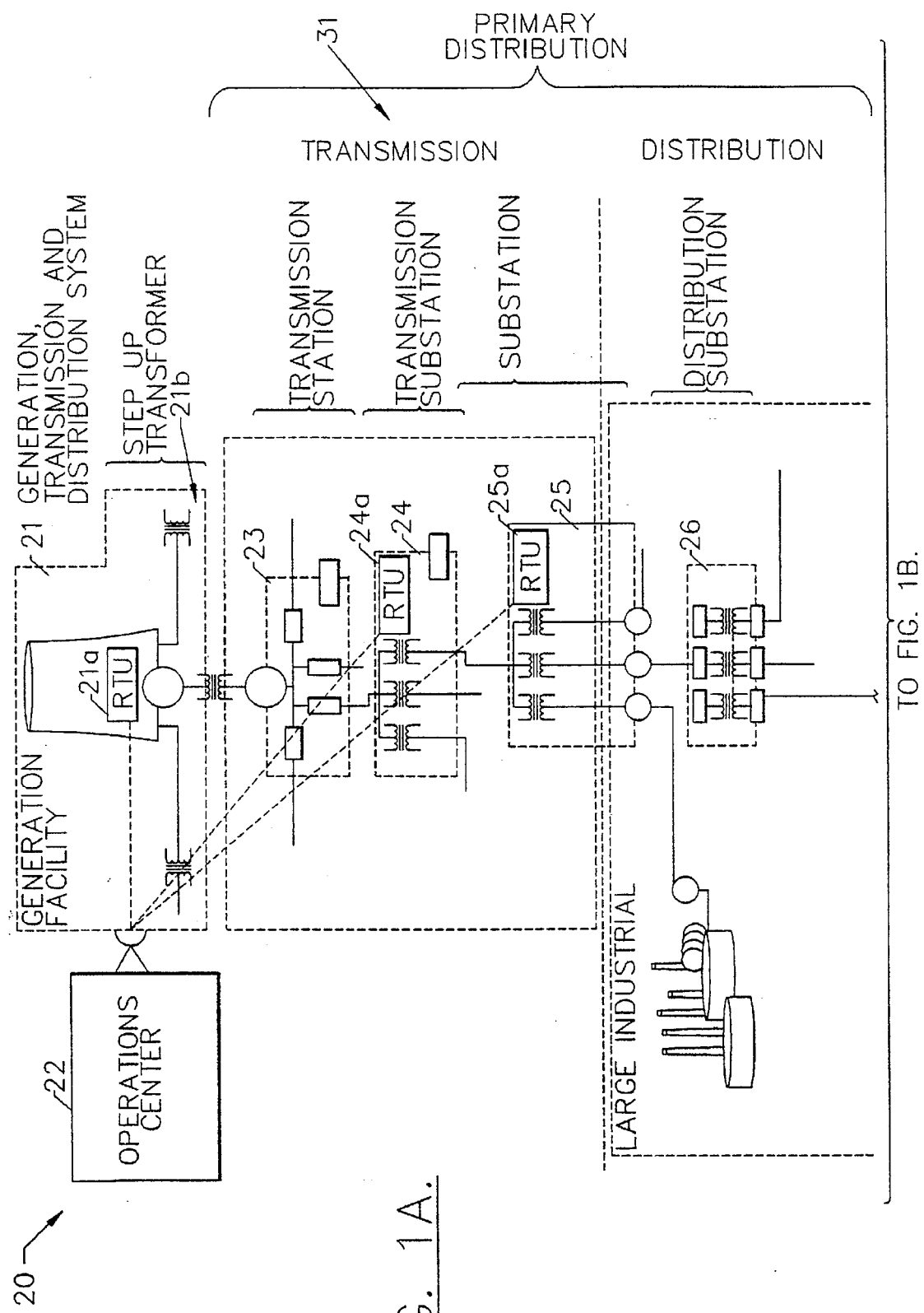

As illustrated in the schematic environmental view of FIGS. 1A and 1B, utility power distribution 20 generally starts with generation of the power by a power generation facility 21, i.e., power generator or power plant. The power generator 21 supplies power through step-up subtransmission transformers 21b to transmission stations 23. To reduce power transportation losses, the step-up transformers 21b increase the voltage and reduce the current. The actual transmission line voltage conventionally depends on the distance between the subtransmission transformers 21b and the users or customers, i.e., commercial, industrial, or residential 41, 42. Distribution substation transformers 25, 26, 27 reduce the voltage from transmission line level generally to a range of about 2–35 kilo-volts ("kV"). The primary power distribution system 31 delivers power to distribution transformers 28, 28a that reduce the voltage still further, i.e., about 120 V to 600 V.

Conventionally, power utility companies and suppliers have developed systems to analyze and manage power generated and power to be delivered to the transmission lines in the primary power distribution system 31, e.g., primarily through supervisory control and data acquisition ("SCADA") at a remote operations center 22 such as illustrated. These operation centers 22 generally communicate with the generation facilities 21 and the substations 24, 25 through conventional data communication terminals 21a, 24a, 25a. Because problems currently arise in the secondary power distribution system 36, i.e., from the distribution substation to the customers, with respect to analyzing power that is delivered to the industrial, commercial, or residential customer sites through the secondary power distribution system 36, a revenue accuracy meter 40, or a plurality of revenue accuracy meters 40 is provided having power quality measurement according to the present invention and preferably is positioned as illustrated (FIGS. 1A–1B) in the secondary power distribution system 36 to provide a remote terminal or node in the overall system 20 for troubleshooting or diagnosing problems, identifying emergency situations, and systematically analyzing information from specific customer sites.

Figure 2A:
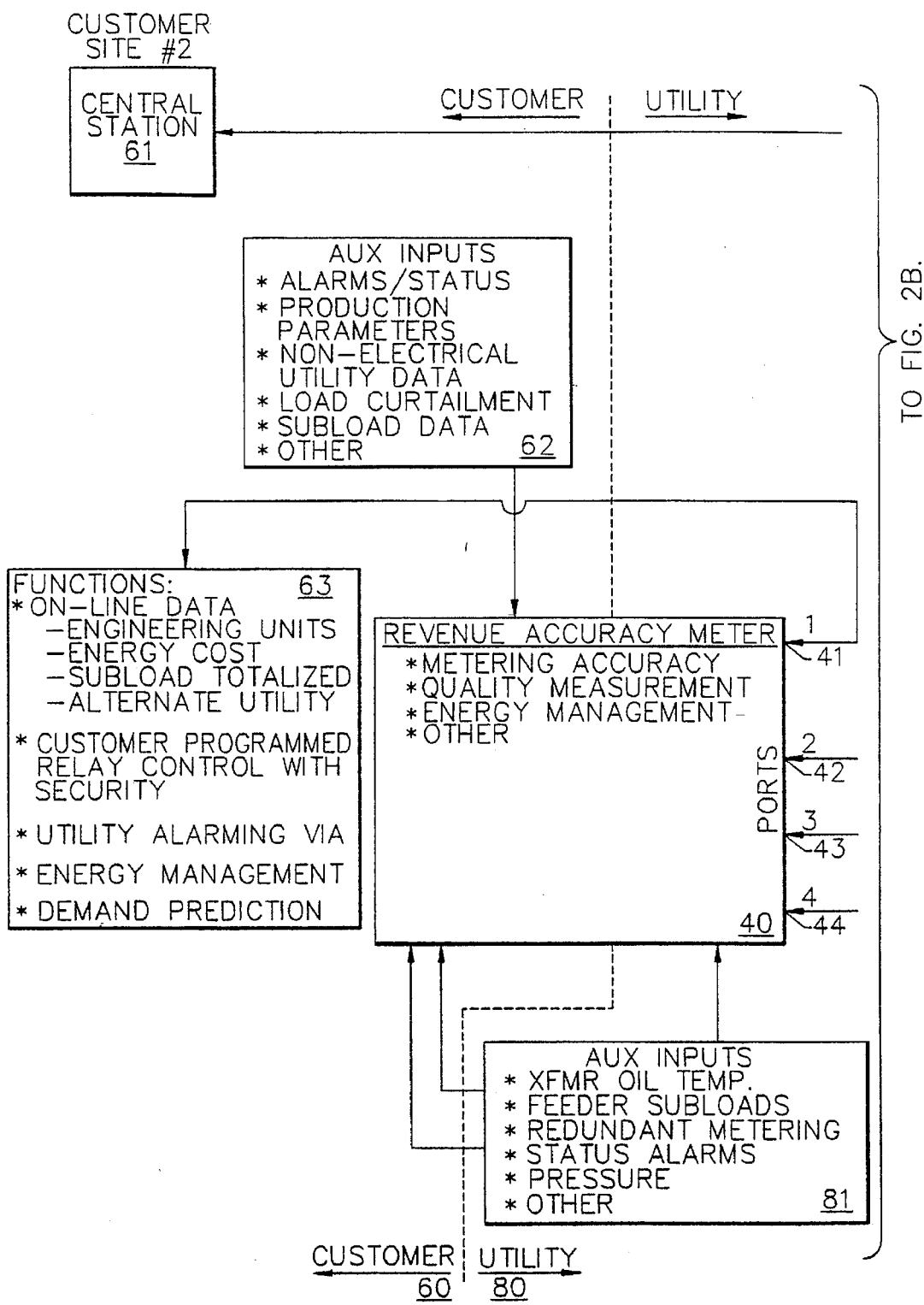
FIGS. 2A and 2B schematically illustrate a revenue accuracy meter having power quality measurement arranged in communication with a power generator and a power customer according to the present invention.
Figure 2B:
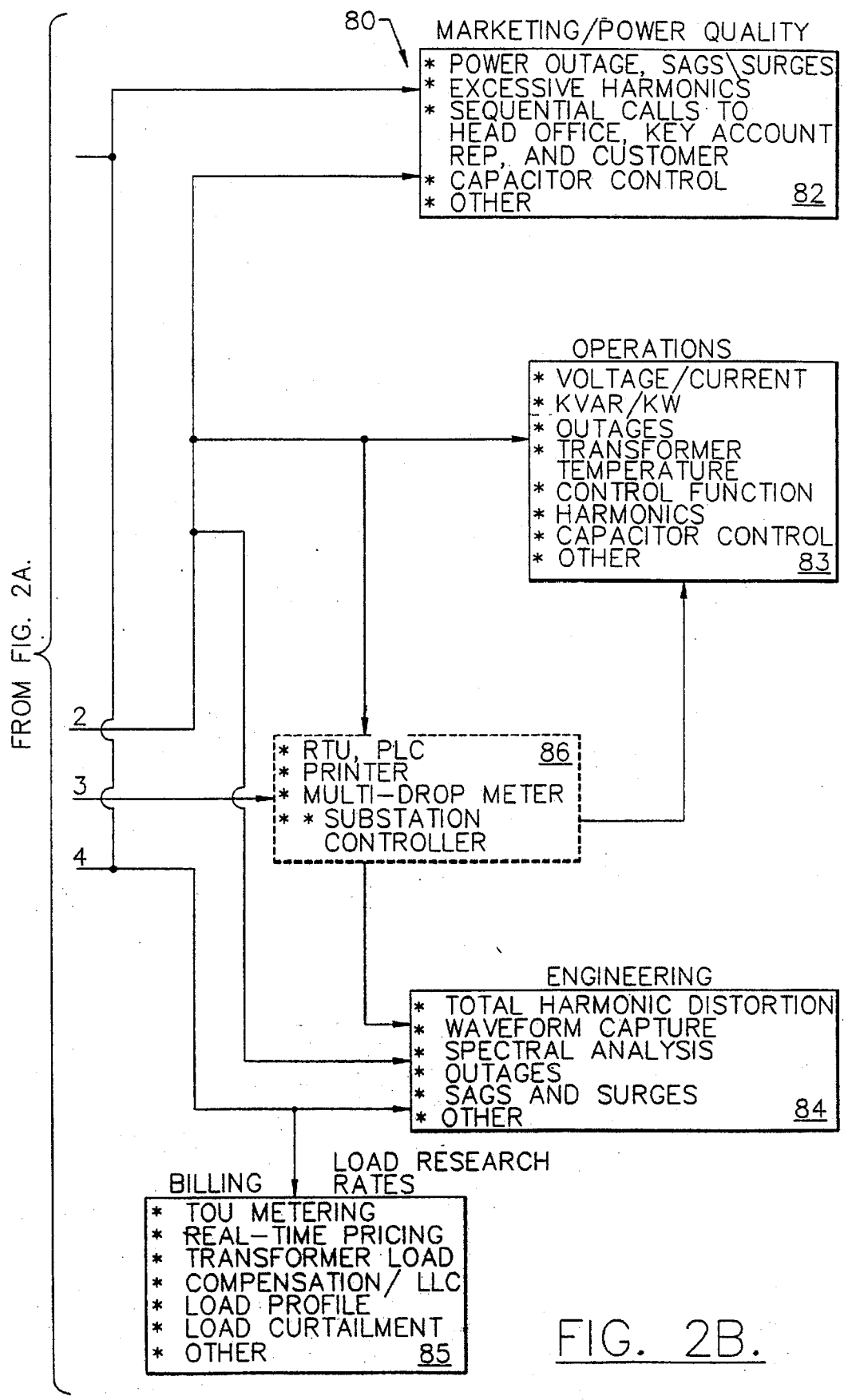
Figure 3:
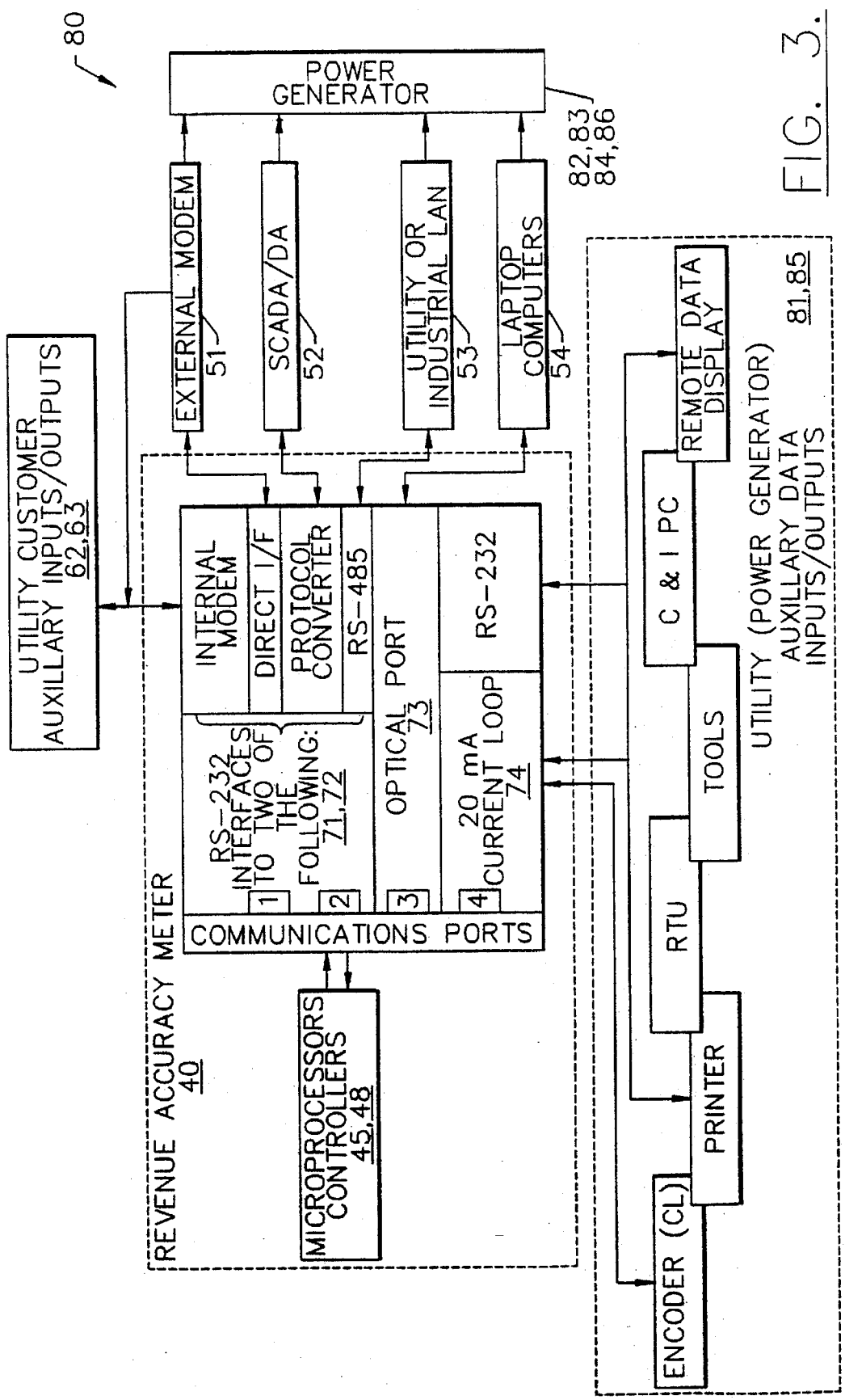
FIG. 3 schematically illustrates a revenue accuracy meter having power quality measurement arranged in communication with various data communication links according to the present invention.

FIGS. 2A, 2B, and 3 schematically illustrate a revenue accuracy meter 40 having power quality measurement arranged in communication with a power generator 80 such as a utility power company and a power customer 60 according to the present invention. A revenue accuracy meter 40 according to the present invention is an electricity meter or an alternating current static watt-hour meter used for billing functions, i.e., billing meter. These revenue power or electricity meters preferably are solid state meters that at least meet American National Standards Institute ("ANSI") 12.16, International Electrotechnical Commission ("IEC") 687/1036 standard, similar improved or revised standards, or the like, as understood by those skilled in the art. As illustrated, the revenue accuracy meter 40 for measuring the amount and quality of electrical power received by a power customer 60 preferably has a housing 40a and a communications interface which preferably includes a plurality of data communication ports 41, 42, 43, 44 positioned in the housing 40a (also see FIGS. 3 and 4A).

Although four data communication ports 41, 42, 43, 44 are illustrated, a revenue accuracy meter 40 according to the present invention preferably has at least two data communications ports. At least one of the plurality of data communication ports 41, 42, 43, 44 is arranged for data communications with a power customer 60, e.g., a power customer port 41, and at least one of the plurality of data communication ports 41, 42, 43, 44 is arranged for data communications with a power generator, e.g., a power generator port 42, 43, 44.

The particular embodiment of the ports 41, 42, 43, 44 illustrated, however, advantageously provides real time data communications with a plurality of the various groups or departments of a utility company 80 such as marketing 82, operations 83, engineering 84, and/or billing/finance 85 (FIG. 2B). For example, power quality data may be utilized by the customer service or the marketing group 82 receiving data from a revenue accuracy meter 40 according to the present invention by monitoring power outage, sags/surges, and excessive harmonics. This information can then be relayed, i.e., by sequential calls, to a head office, key account representatives, and/or customers 60. Power quality data may be utilized by operations 83 to monitor voltage/current, KW/KVAR, outages, and/or harmonics received by customers 60 through the meter 40 and to monitor transformers, i.e., temperature, capacitors, and other control functions in the power distribution system 20.

The engineering group or department, for example, may utilize the meter 40 and the data received therefrom for monitoring total harmonic distortion, for capturing waveform data, for conducting spectral analysis, as well as studying and analyzing outages and sags/surges from a diagnostic approach. The billing or finance group 85, in turn, may conduct load or rate research based upon information provided from the meter 40 about power quality and power usage. As understood by those skilled in the art, the billing group 85 of the power generator 80, for example, can conduct TOU metering, real-time pricing, transformer loss, compensation, load profile, meter installation integrity, meter wiring verification, load curtailment, and/or various other functions. Also, these various groups of the power generator 80 can also responsively interact with the substation controller 86 such as in multi-drop meter applications or to communicate with remote terminal units ("RTUs"), printers, or the like. Further, the power generator 80 can provide various auxiliary inputs to the meter 40 such as transformer oil temperature data, feeder subloads, redundant metering data, status alarms, pressure data, and/or other information as desired.

Figure 8A:
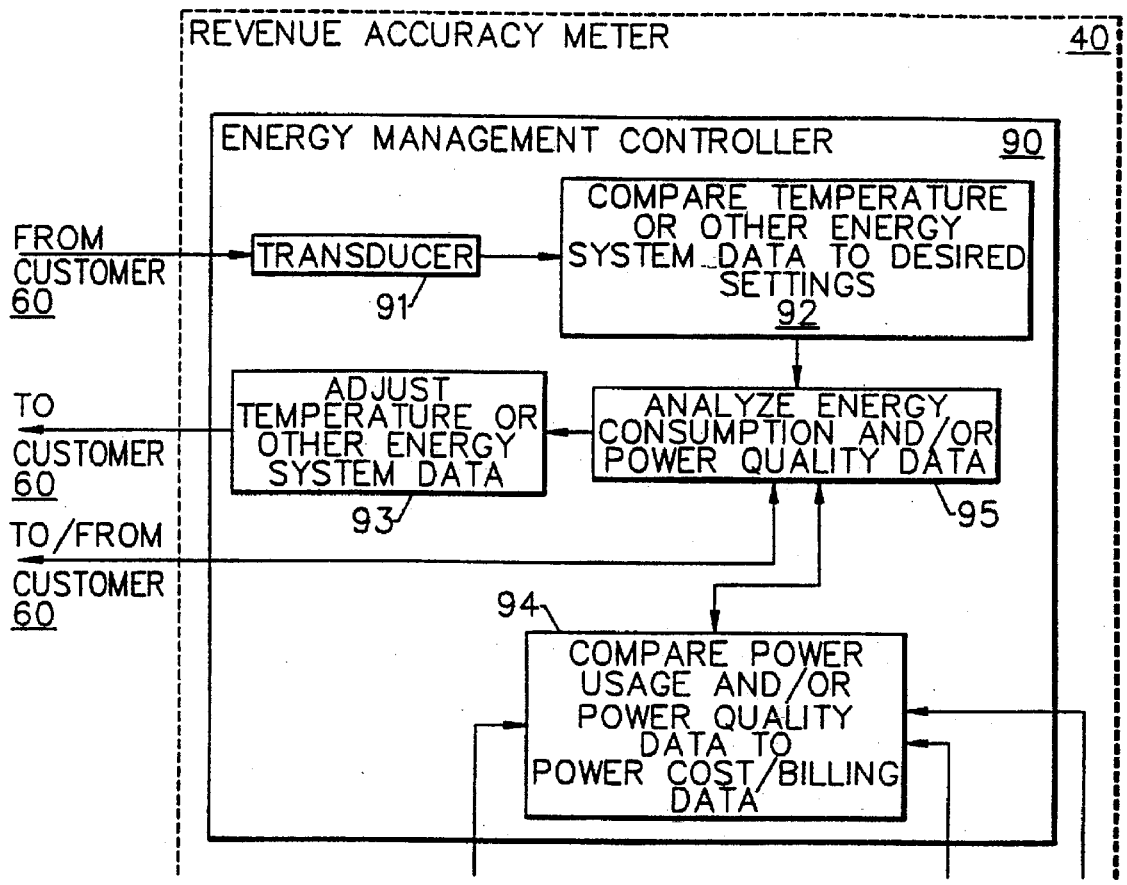
FIGS. 8A and 8B schematically illustrate a revenue accuracy meter having power quality measurement and energy management according to a second embodiment of the present invention.

The customer, on the other hand, can receive on-line data such as engineering units, energy cost, subload data, alternate utility data, and other totals or specific information as needed. Preferably the meter 40 also has customer programmed relay control with security, utility alarming, demand prediction, and energy management capabilities. Additionally, as also illustrated in FIGS. 2A and 8A, a revenue accuracy meter 40 according to the present invention further has an energy management controller 90 electrically connected to the second receiver and the second transmitter for controlling power usage responsive to predetermined command signals received from the power customer through the power customer port of the communications interface. Likewise, the customer may provide auxiliary inputs 62 to the meter 40 such as alarms, status, production parameters, non-electrical utility data, load curtailment data, subload data, as well as other data as desired. The meter 40 may also be monitored or utilized by the customer at a customer central station 61 as illustrated. The data communication ports also provide inter or intra-customer communication, i.e., customer to utility or other customer and communication within customer facility or locations.

Either separate from the energy management controller 90 or in conjunction therewith, a meter 40 according to the invention preferably further has an access restricter 98 coupled in electrical communication with the power generator port for providing restricted access between the power customer port and the power generator port. This security access preferably is resident in one of the controllers of the meter 40. This access restriction means or access restricter 98 (see FIG. 8B) preferably is software programmed as understood by those skilled in the art so that access is provided to either the power customer or the power generator by a command signal representative of a user password or a data access key. This, in turn, provides a wall for security between meter functions used by a customer 60 and meter functions used by a power generator or other third party 80.

Although, as understood by those skilled in the art, the communication interface of a revenue accuracy meter 40 may include any means for communicating data to and from the meter 40, such as using a probing device, an optical device, or a remote device for interfacing with the meter 40, the communications interface of a revenue accuracy meter 40 preferably includes one or more transceivers, e.g., universal asynchronous receiver/transmitter ("UART"), positioned within the housing 40a of the meter 40 and arranged to receive and transmit data signals through the data communication ports 41, 42, 43, 44. According to the invention, the communications interface preferably includes at least one receiver positioned for receiving an electrical signal representative of voltage received across electrical power lines. The at least one receiver is arranged for receiving electrical signals through the power generator port. The at least one receiver preferably also includes first and second receivers and the at least one transmitter preferably also includes first and second transmitters. The first receiver is arranged for receiving electrical signals through the power generator port 42, 43, 44, and the second receiver is arranged for receiving electrical signals through the power customer port 41.

As best illustrated in FIG. 3, the ports for communicating with the power generator or utility 80 preferably are electrically connected to the microprocessor or controllers 45, 48. These ports preferably include an RS-232 interface port and/or a 20 milliampere ("mA") current loop 74, an optical port 73, and two 71, 72 of either an internal modem, a direct interface, a protocol converter, or an RS-485 port. The internal modem is arranged for communicating with utility customer or power customer auxiliary inputs and outputs 62, 63. The direct interface ("I/F") is arranged to connect to an external modem 51 which may provide either additional or duplicative data to the processors 45, 48. The protocol converter and the RS-485 port are likewise arranged to provide data communication to the operations center 22 as well as the local area network ("LAN") of the utility company or industrial consumer. The optical port 73 preferably is arranged for data communication through a power generator port to laptop computers or the like. The current loop 74 provides secure data communication and, preferably, is arranged for data communication with the auxiliary inputs 81, 85 from the utility 80, such as an encoder, printer, RTU, various software or hardware tools, personal computer, remote data display, or the like. The external modem 51, the SCADA 52, the LAN 53, and the laptop computers 54 are connected in electrical communication with the desired group 82, 83, 84, 86 of the utility or power generator 80 as illustrated.

Figure 4A:
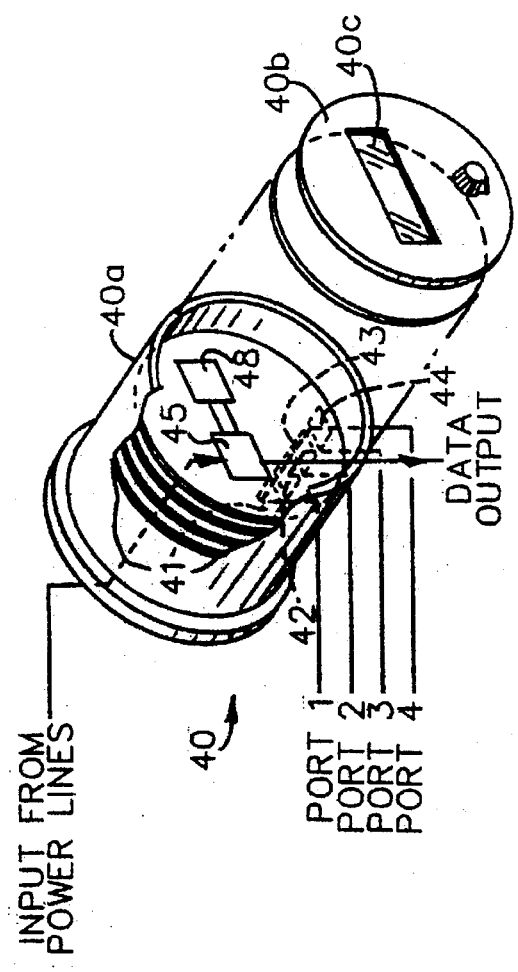
FIG. 4A illustrates a revenue accuracy meter having process controllers having power quality measurement according to the present invention.
Figure 4B:
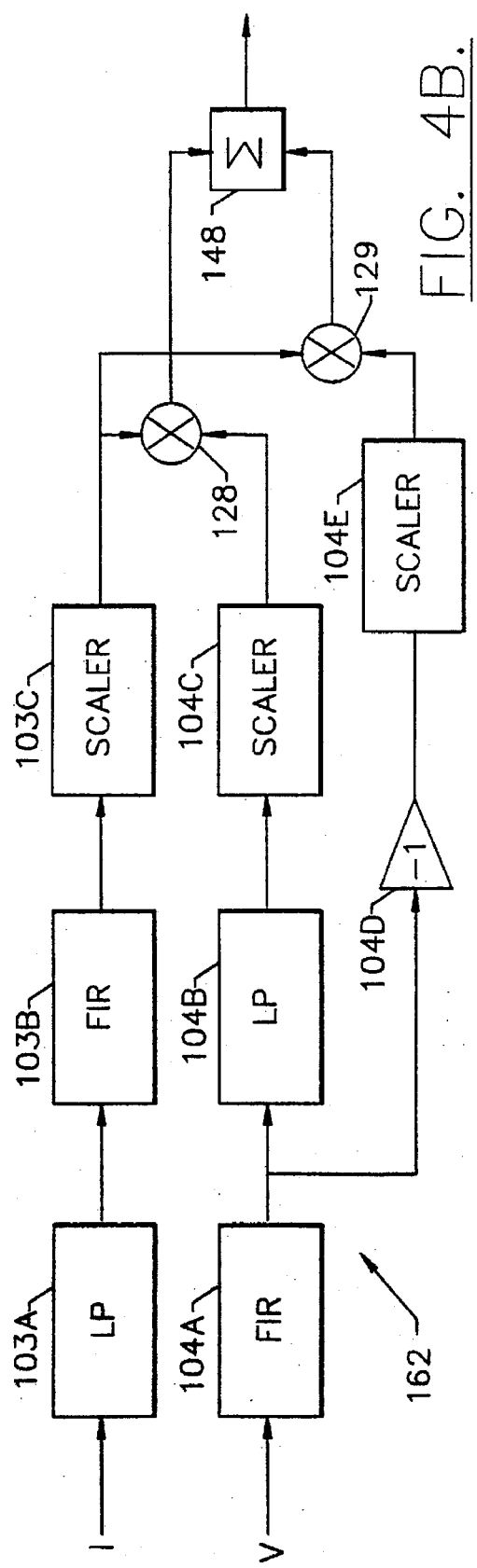
FIG. 4B schematically illustrates a reactive power measurer of a revenue accuracy meter according to the present invention.

FIGS. 4A–8B further schematically illustrate a revenue accuracy meter 40 having power quality measurement according to the present invention. FIG. 4A schematically illustrates the process controllers, i.e., a digital signal processor 45 and a main meter processor 48, for a revenue accuracy meter 40 having power quality measurement 200 according to the present invention receiving power or voltage input such as across power lines. For example, once the power quality is determined and the power usage is measured, electrical signals, or other data retrieval means, are transmitted from the meter 40 to a power generator, a power consumer, or other party desiring the data, i.e., preferably through data communication ports 41–44. By providing the two processors 45, 48 within the housing 40a of the meter 40, the meter 40 effectively operates as a remote computer terminal or node in the power distribution system 20 for providing various types of operational capabilities within the meter 40, i.e., power quality measurement 200, energy management 90, customer central station 61 interaction. Data or other information may also be visually communicated to a user or meter reader by a display 40c preferably positioned along a front face 40b of the housing 40a.

Preferably within the digital signal processor 45, as best illustrated in FIGS. 5A–8B, the revenue accuracy meter 40 of the invention has means for determining the presence of undesired variations in the electrical signal representative of power received by a power customer 60 across electrical power lines or the like such as spikes, surges, sags, or harmonic distortion, as well as blackouts, brownouts, and other distribution system problems, i.e., alarm conditions. The variation determining means preferably is a variation determiner, or other power quality measurer 200, as illustrated coupled in electrical communication with the receiver for determining frequency, i.e., time periods or time occurances, and duration of undesired variations in the received voltage signal during a plurality of predetermined time periods. These undesired signal variations are preferably minimum or maximum threshold variations and/or timing frequency variations of the supplied signal.

Figure 5A:
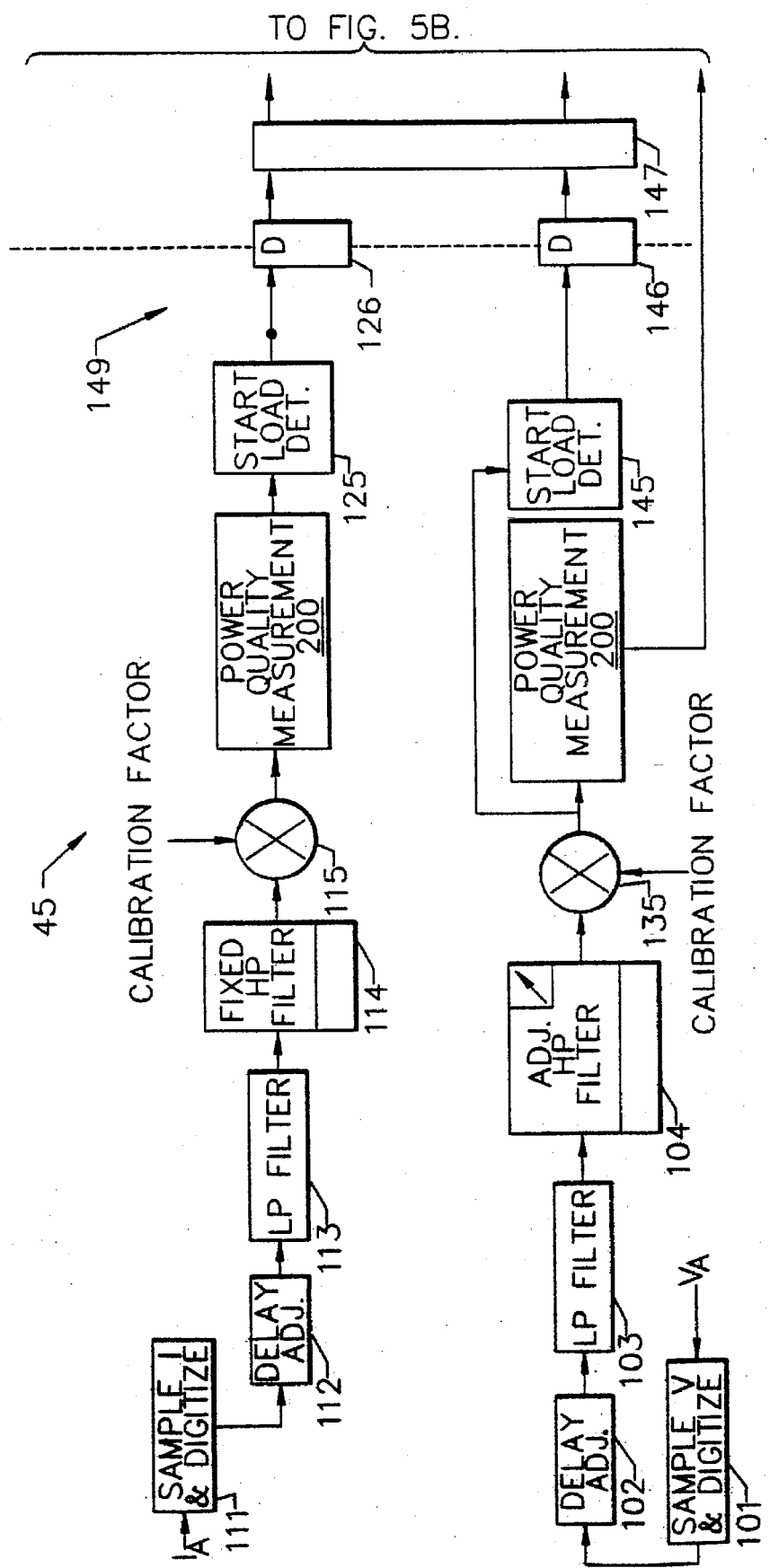
FIGS. 5A and 5B schematically illustrate a flow chart of a digital signal processor of a revenue accuracy meter having power quality measurement according to the present invention.
Figure 5B:
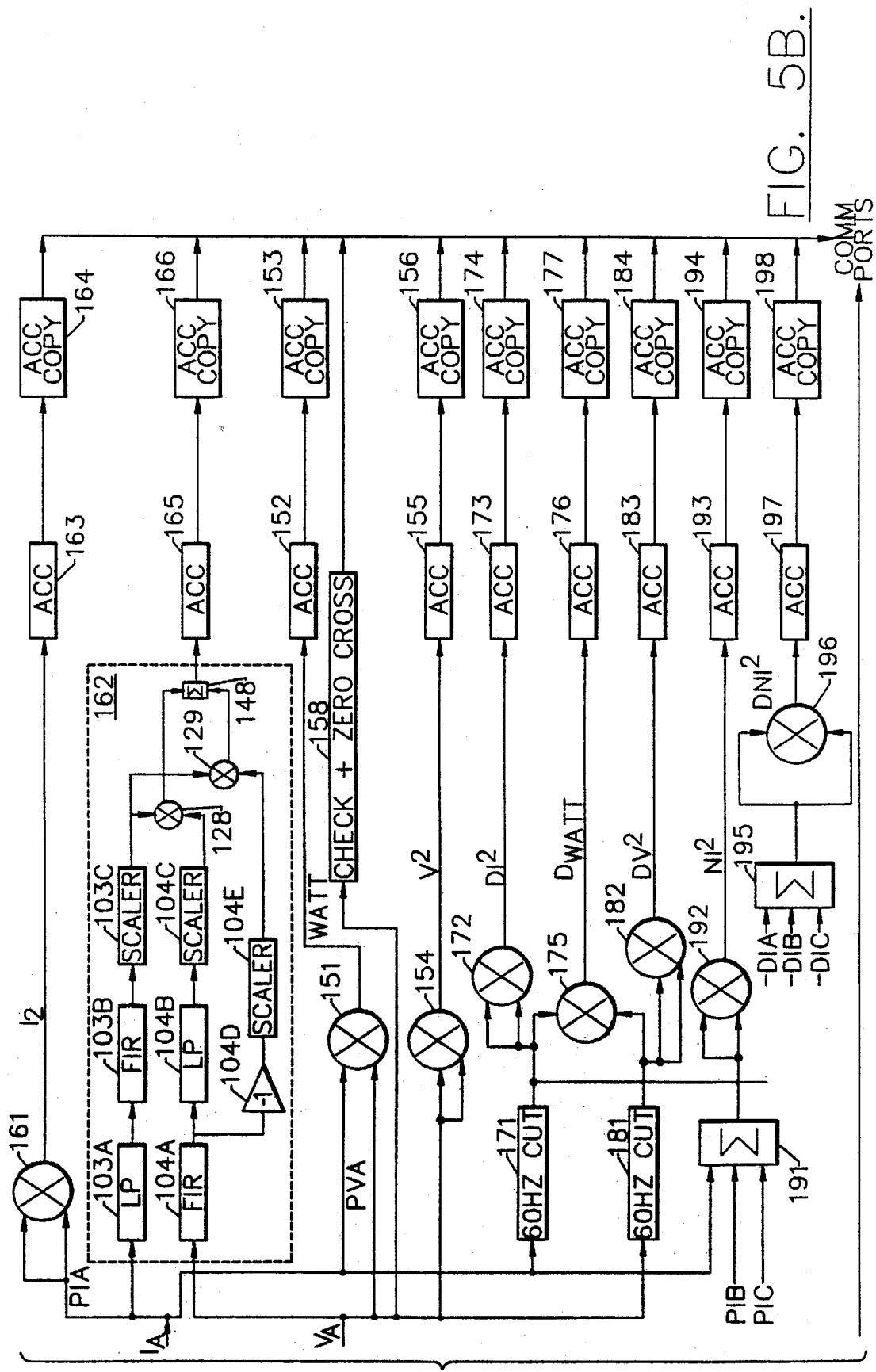

As best illustrated in FIGS. 5A and 5B, an electrical signal representative of power received by a power customer is received by the meter 40. The power preferably is received as an analog voltage signal, but may also include an analog current signal as illustrated. This analog signal is preferably converted to a digital signal such as with an analog-to-digital converter as understood by those skilled in the art. As understood by those skilled in the art, the meter 40 of the present invention would also be applicable to single-phase, three-phase, or other multi-phase electrical power signals. The meter 40 receives the electrical signal from the power lines and the voltage and/or current signal is sampled 101, 111 and digitized. Time compensators 102, 112 compensate for time skew in sampling due to multiplexing a single analog-to-digital converter. These preferably are short FIR or smoothing filters with non-symmetrical coefficients to get the proper time skew with a reasonably flat frequency response.

The compensated signals then are respectively received by low pass filters 103, 113. The current signal passes through a fixed high pass filter 114 and the voltage signal passes through an adjustable high pass filter 104. A calibration factor 115, 135 is then respectively applied to the filtered signals and the signal is applied to the power quality measurement system 200 of the meter 40 according to the present invention. As understood by those skilled in the art, the power quality measurement system 200, as well as portions of the energy management controller 90, of the meter 40 preferably is in the form of software and/or hardware resident within or in electrical communication with the digital signal processor 45 of the present invention, and as further described and illustrated with respect to FIGS. 6–8B.

The revenue accuracy meter 40 as best illustrated in FIGS. 5A–5B and 8A–8B also in combination with the power quality measurement system 200 has means for measuring power usage of a customer load of a power customer. The power measuring means preferably is a power usage measurer 145, which preferably includes a load detector, arranged for receiving an electrical signal representative of a customer load and for measuring the power usage of a customer responsive to the electrical load signal. A memory 131 preferably is coupled in electrical communication with the variation determiner and the power usage measurer of the meter 40 for storing signal representative of the undesired variations in the received voltage signal and the power usage. At least one transmitter preferably is coupled in electrical communication with the memory 131 for transmitting signals representative of the undesired voltage signal variations and the power usage to a power generator 80. The at least one transmitter, and preferably more than one if desired, is responsive to a predetermined command signal received by the at least one receiver such as from the power generator 80 or power customer 60.

Once the power quality measurement, i.e., frequency and duration of undesired variations, has been determined and preferably stored in a memory device 131, such as memory resident in the processor 45, the power usage is then preferably measured by initiating start customer load detector 125, 145. As understood by those skilled in the metering art, these detectors 125, 145 preferably assure that relatively very small signals, i.e., due to leakage current, register as zero usage. The signal then passes through delay adjustments 126, 146 to lower the sampling rate, i.e., decimation. The delay adjustments preferably allow the normal power measurement process to run at a slower rate and therefore use less of the resources of the microprocessor or digital signal processor. The signal passes to a system configuration block 147 to allow for special meter types such as a 2-½ wye meter.

As illustrated in FIG. 5B, the signal further passes through a filtering configuration 162 (see also FIG. 4B) preferably such as illustrated. The current signal preferably is applied to a low pass filter 103A. This filter 103A produces a phase shift that approaches 90 degrees lag as the frequency of the amplitude signal increases. This filter 103A also produces an amplitude response that decreases with frequency, which is compensated by the two FIR filters 103B and 104A as illustrated. The output of the voltage FIR filter 104A is then applied to a low pass filter 104B. Because the VAR measurement preferably may require a 90 degree lag of voltage relative to current, as understood by those skilled in the art, and the current is lagged by 90 degrees already, an additional lag of 180 degrees is needed in the voltage. A signal inversion by an inverter 104D preferably supplies this lag. The output of multiplier 129 is then VARs with errors due to 103A only approaching 90 degrees. Multiplier 128 produces an error correction signal of the correct level and phase to correct the errors when summed in summer block 148. The scalers 103C, 104C, and 104E preferably adjust signal levels so that watts and VARs have the same scale factors in the system 162. The outputs of multipliers 151, 154, 161, and 192 are the amperes squared, watts, volts squared, and neutral amps squared as measured by conventional metering. Multipliers 172, 175 and 182 preferably have their input 60 Hertz fundamental removed by filters 171 and 181 so that their outputs are the harmonic amperes squared, harmonic watts, and harmonic volts squared. As illustrated by FIG. 5B, multiplier 192 also has as its input the output of a 3-phase current summer 191. These values or quantities are then integrated in accumulators 152, 155, 163, 165, 173, 176, 183, 193, 197 and copied 153, 156, 164, 166, 174, 177, 184, 194, 198 for transmitting through the communication ports. In addition, the harmonic amperes for the three phases are summed and multiplied (Blocks 195, 196) to generate harmonic neutral current squared. The original signal prior to the filter is also checked at block 158. The zero cross signal from block 158 causes the accumulator copies 153, 156, 164, 166, 174, 177, 184, 194, 198 to have an integer number of cycles such as for stable short term readings.

Figure 6:
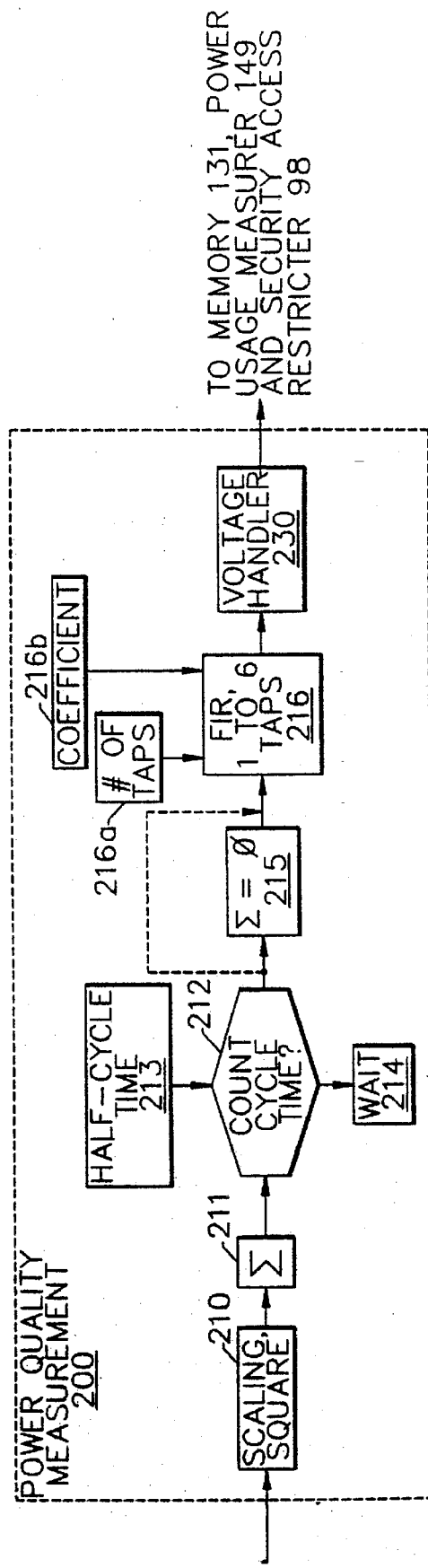
FIG. 6 schematically illustrates a power quality measurement system in a digital signal processor of a revenue accuracy meter according to the present invention.

FIG. 6 illustrates a power quality measurement system 200 of the invention illustrated in the form of a variation determiner. The variation determiner of a revenue accuracy meter 40 of the invention preferably includes a scaler 210 coupled in electrical communication to the receiver for scaling the voltage signals. The scaled signal is then summed 211, and a voltage cycle time determiner 212 is coupled in electrical communication with the scaler and/or squarer 210, i.e., through the summer 211, for determining voltage cycle time. The scaler 210 preferably scales the size of the signal to assure against math overflows. The scaler 210 also preferably squares the signal so as to make the meter responsive to root mean square ("RMS") voltage. Half-cycle timing 213 and waiting 214 periods are preferably for synchronizing or zeroing the sum 215 of the timing of the system 200. Accumulation preferably occurs for one-half cycle, passes the result to an FIR filter 216, then clears the accumulator, i.e., $\Sigma=0$.

The multiple tap FIR filter 216, i.e., preferably 1–6 taps, is coupled in electrical communication with the cycle time determiner 212 for smoothing and/or filtering the voltage squared signal. The number 216a and the coefficients 216b for the taps are input into the FIR signal smoothing device 216. It will also be understood that the electrical signals as illustrated in FIGS. 6–7C of the power quality measurement system 200 are illustrative for the voltage signals, but under appropriate current signal characterization parameters may also include the current signals. The variation determiner also further includes a voltage handler 230 which preferably has a comparator 231 coupled in electrical communication with the filter 216 for comparing voltage signals to a predetermined voltage threshold value and a time period determiner 241, i.e., duration, coupled in electrical communication with the voltage comparator 231 for determining the time period that the voltage signal is above or below the predetermined voltage threshold value.

Figure 7A:
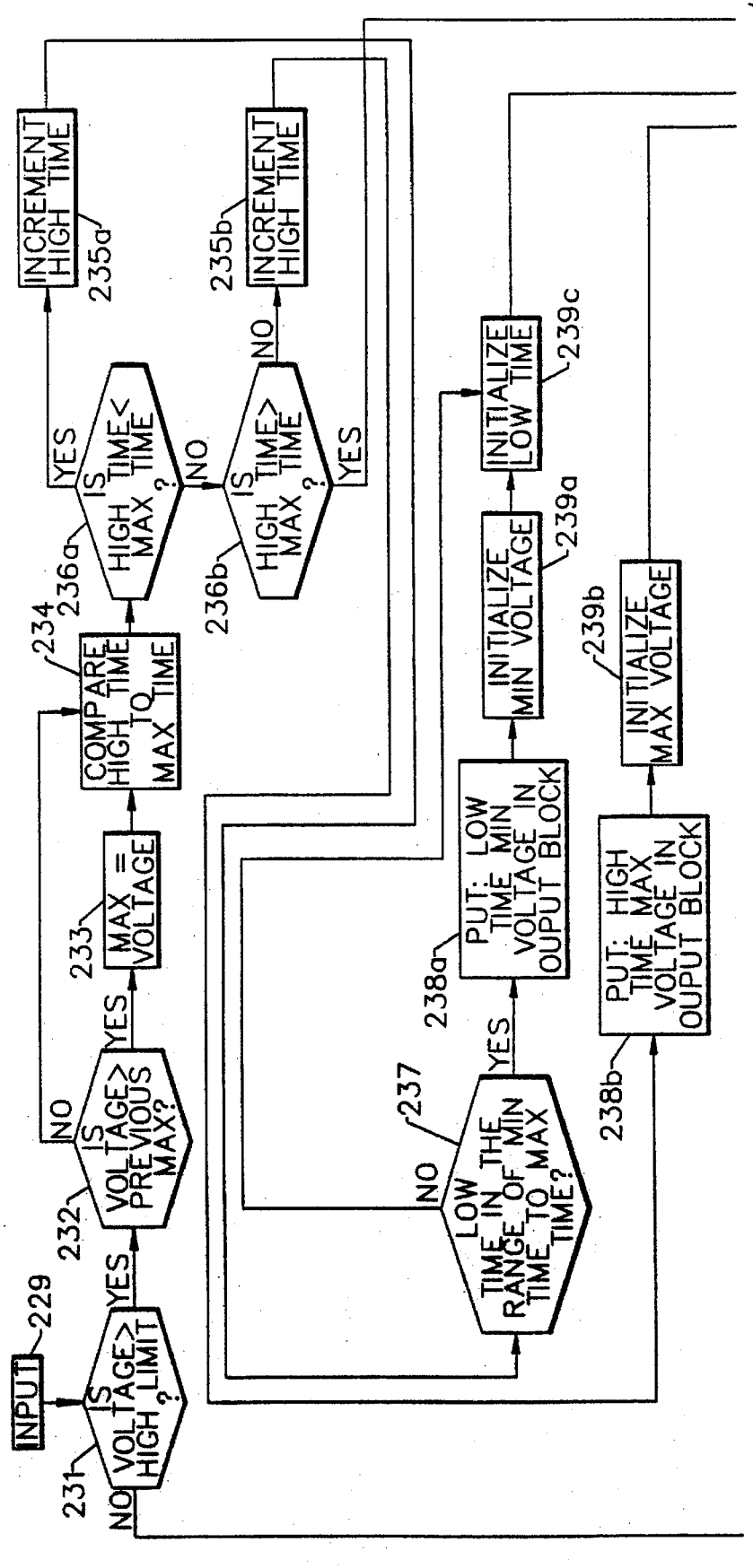
FIGS. 7A, 7B, and 7C schematically illustrate a variation determiner of a power quality measurement system in a digital signal processor of a revenue accuracy meter according to the present invention.
Figure 7B:
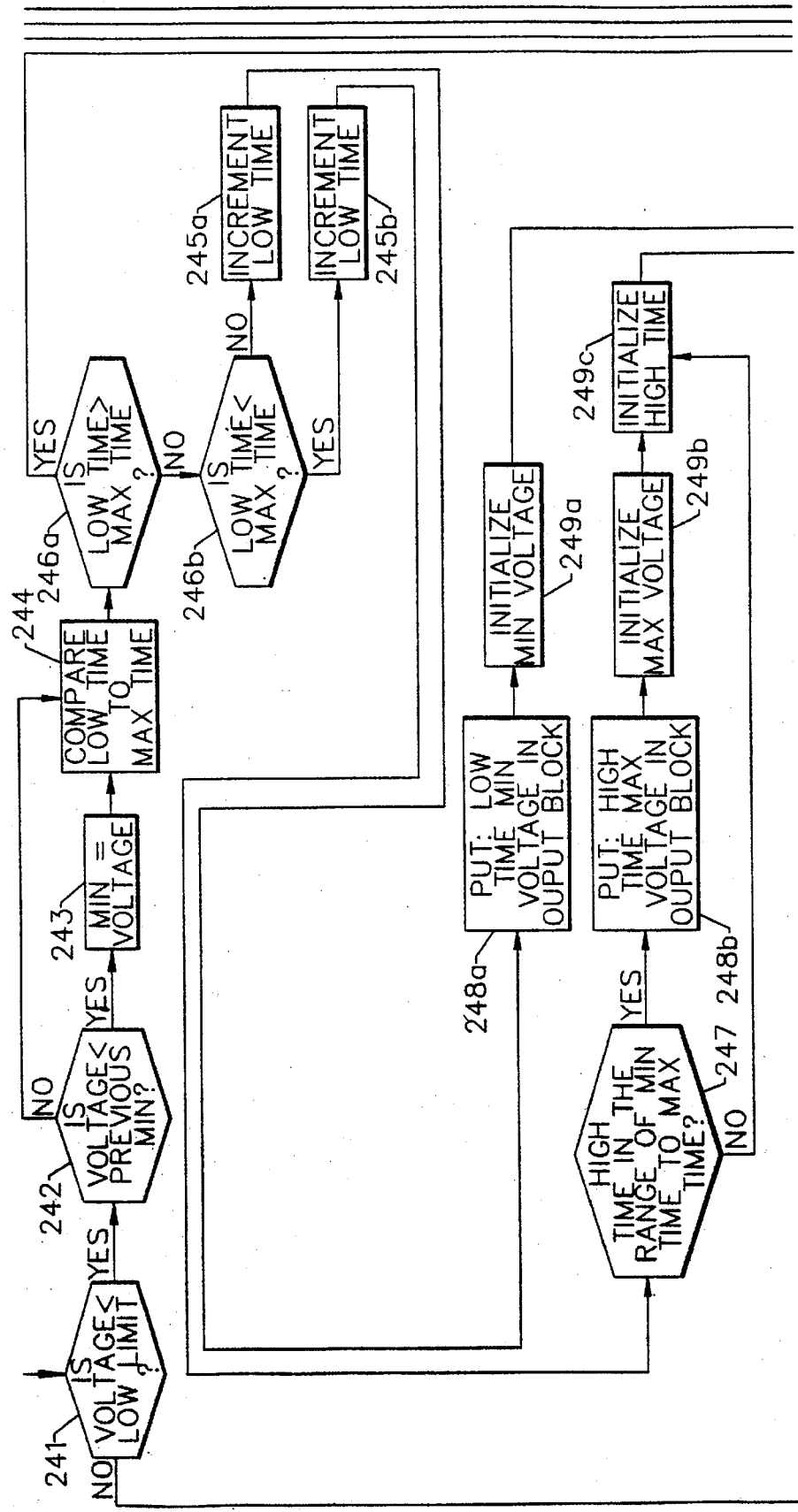
Figure 7C:
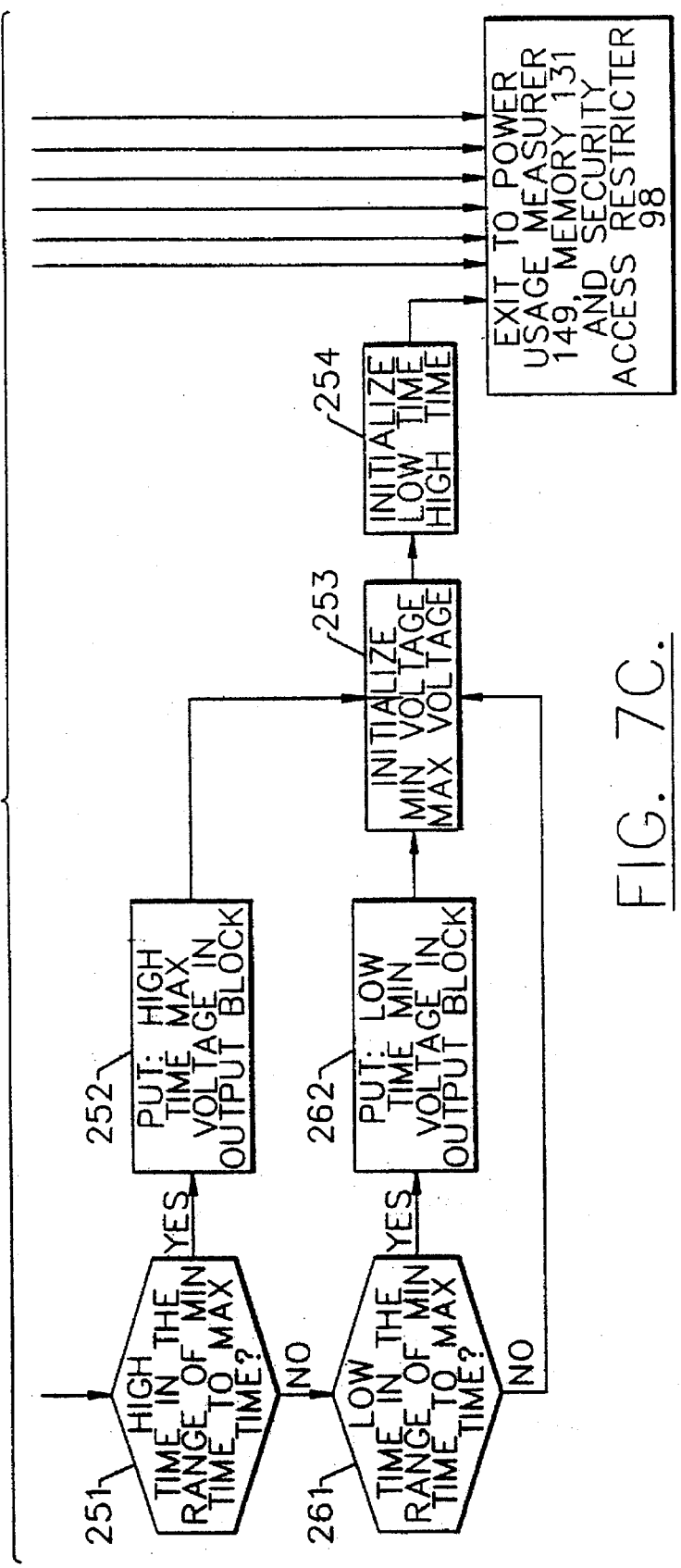

As best illustrated in FIGS. 7A, 7B, and 7C, the variation determiner further more particularly has a variation determining means, primarily in software or computer program code, having a flow path as illustrated. The input 229 is received from the smoothing filter 215 into the voltage handler 230 and the output is to the start load detector 145. The voltage handler 230 upon completion preferably passes program control to the start load detect 145 but no data flows between these processes. The voltage handler 230 preferably then stores power quality data in a reporting system buffer or memory 131 (see FIG. 8B) for the data communications tasks, i.e., through data communication ports 41-44 (see FIG. 3).

Referring now to FIG. 7A, the inputted voltage signal passes to decision block 231 which compares the voltage level with a predetermined threshold. If the voltage is too high or greater than a high limit, then a determination is made on whether the voltage is greater than the previous maximum 232. If the voltage is not greater than the high limit, a check is made to see if it is less than a low limit, Block 241 (see, e.g., FIG. 7B). The maximum and minimum threshold values preferably include a tripping value so that the voltage value preferably has a low maximum trigger value and a high minimum trigger value. If the voltage is greater than the previous maximum, then the voltage is set to new maximum value 233 and the high time is compared 234. If high time is less than the maximum predetermined time threshold 236a, then the high time is incremented upward 235a and a check is made to see if the low time is in the range between the minimum time and the maximum time, Block 237. if the low time is in the range, then the low time is stored in the output block, Block 238a, the minimum voltage is initialized, Block 239a, and the low time is initialized, Block 239c. Otherwise, just the low time is initialized. If the high time is neither less than nor greater than the maximum time (i.e., high time=maximum time), which means a recordable voltage surge event has just occurred, the high time is incremented upward, Block 235b, the high time is stored in the output block, Block 238b, and the maximum voltage is initialized, Block 239b. Finally, if the high time is greater than the maximum time, Block 236b, indicating that a voltage surge event of predetermined duration has already occurred, the program exits.

Referring now to FIG. 7B, in the event the voltage is not greater than the high limit, Block 231, a decision is made as to whether the voltage is less than a predetermined low limit, Block 241. If no, the voltage is within range and control is passed to Block 251. If yes, a decision is then made to determine whether the voltage is less than the previous minimum, Block 242. If yes, the value "min" is set to the value of the voltage, Block 243. As illustrated by Block 244, a comparison is then made between the low time and the maximum time, Block 244, by determining whether the low time is greater than the maximum time, Block 246a (which means a recordable voltage sag event of predetermined duration occurred during a prior cycle), whether the low time is equal to the maximum time, Blocks 246b, 245a (which means a recordable voltage sag event has just occurred during the current cycle), or whether the low time is less than the maximum time, Block 246b (which means a recordable voltage sag event has yet to occur). As illustrated by Blocks 245a, 248a and 249a, if a recordable voltage sag event has just occurred, the low time is incremented and stored in the output block and the minimum voltage is initialized, before exiting. However, as illustrated by Blocks 245b, 247, 248b, 249b and 249c, if a recordable voltage sag event has not yet occurred, the low time is incremented and then a check is made to see if the high time is in the range between the minimum time and the maximum time, Block 247. If the high time is in the range, than the high time is stored in the output block, Block 248b, the maximum voltage is initialized, Block 249b, and the high time is initialized, Block 249c, before exiting. Otherwise, just the high time is initialized before exiting.

Referring now to FIG. 7C, checks are made to determine the high and low times (depending on whether a voltage surge or sag has occurred, respectively) are within the range between the minimum time and maximum time, Blocks 251, 261. If yes, the respective high or low times are stored in the output blocks, Blocks 252, 262 and then the respective voltages and times are initialized, Blocks 253, 254, before exiting. If no, the respective voltages and times are just initialized, Blocks 253, 254, before exiting.

As described above, each of the voltage minimum and maximum values preferably having a tripping value or range which sends the signals into the logic flow paths best illustrated in FIGS. 7A, 7B, and 7C. The tripping or range, i.e., hysteresis effect, allows for an upper and low value before a high or low is determined to be registered by the system as an undesired voltage, or current, signal. Otherwise the value is determined to be in a normal desired range.

Figure 8B:
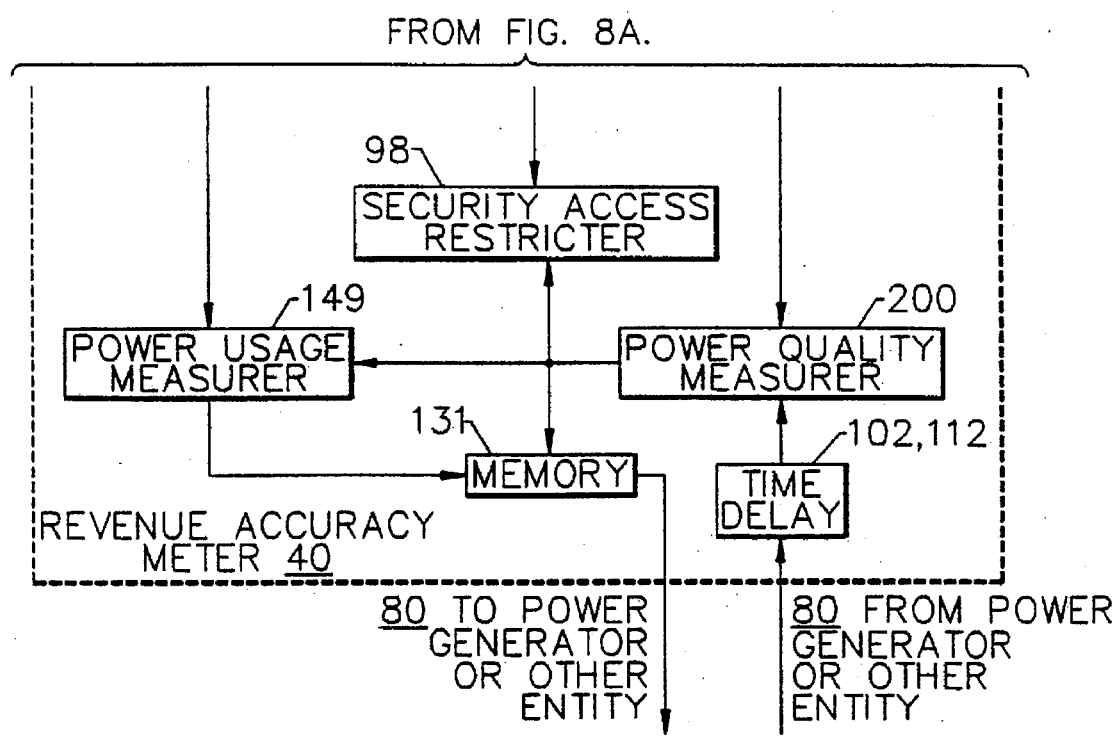

As illustrated by FIGS. 7C and 8B, the outputs are then transferred to the memory 131 or data communication ports 41-44 as the measuring by the meter 40 continues. This signal variation information provided by the voltage handler 230 of the meter 40 which reflects the quality of power not only provides competitive information for utility companies and customers thereof, but also provides troubleshooting information for utility companies and customers in areas of power distribution such as through a secondary distribution system.

FIGS. 8A and 8B further illustrates a revenue accuracy meter 40 having the combination of power quality measurement 200, power usage measurement 145, and energy management according to the present invention. As illustrated, the revenue accuracy meter 40 receives a signal from a temperature controller or HVAC controller from a customer 60 into a transducer 91. A signal is responsively converted to an electrical signal by the transducer 91 and compared to temperature, or other energy system data, to desired predetermined settings 92. This data is then analyzed by an energy analyzer 95 preferably to analytical calculate optimum desired settings based on power cost or billing data 94 and/or to perform various load curtailment functions. The analyzer 95 then responsively communicates to a power customer's energy system to adjust temperature or other energy system settings 93 as illustrated.

Because the revenue accuracy meter 40 preferably includes a power quality measurer 200, the energy management controller 90 of the meter 40 can advantageous include real time information to the power customer 60 about the quality of power received and how this affects the customer's energy usage and control capabilities. Additionally, this information can then be used to adjust billing calculations or projected energy usage costs related to the quantity of power used and/or the quality of the power supplied from the power generator 80. It will also be understood by those skilled in the art that such a meter 40 according to the invention may also include information related to a third party or same party power generator such as a large industrial company, i.e., cogeneration. The security access restricter 98 as illustrated and as previous described can provide the customer 60 with data or information related to energy management and/or power quality separate from the power generator 80. It will also be understood that this security access restricter 98 may be provided by the power generator 80 to allow the customer 60 only limited access to data from the revenue accuracy meter 40 according to the present invention.

The energy management controller 90 also preferably provides centralized data retrieval and management from the energy analyzer 95 responsive to predetermined command signals from a customer 60. These functional capabilities preferably include spreadsheet interface, basic reporting, record-keeping, overall system control, enhanced user interfaces, and other real-time access to energy utilization data for statistical manipulation and graphic presentation to the customer 60. These manipulation capabilities preferably are software driven with computer programs resident in a microprocessor or memory in communication therewith, and preferably include kilowatt load curves for day, week, and month, kilowatt duration curves, kVA/kQ load curves, power factor curves, energy worksheets, demand worksheets, excessive reactive worksheets, fuel recovery, contract minimum demand, rate worksheets, billing dates table, demand history table, season demand multiplier table, and predictive monitoring. The communication is preferably through a modem or other data communication interface, i.e., data communication ports 41–44, with the customer 60 as understood by those skilled in the art.

Also, according to the present invention as described above and as further illustrated in FIGS. 1–8B, methods of measuring the quality of power received by a power customer 60 are provided. The method preferably includes determining frequency and duration of undesired variations in an electrical signal representative of power received by a power customer 60 across electrical power lines during a plurality of predetermined time periods and communicating a signal representative of the undesired power variations to a power generator 80. The method preferably further includes measuring power usage of a power customer 60 responsive to an electrical signal representative of a customer load and communicating a signal representative of the amount of power used responsive to a command signal received from a power generator 80 or other entity.

Another method of measuring the quality of power supplied across electrical power lines by a power generator 80 is further provided by the present invention. The method preferably includes receiving an analog signal representative of voltage received across electrical power lines and converting the received analog signal to a digital signal representative of the voltage. The frequency and duration of undesired variations in the digital voltage signal during a plurality of predetermined time periods are then determined. The data representative of these undesired variations are then stored and signals representative of the frequency and duration variations are transmitted to a power generator 80 responsive to a predetermined command signal received from the power generator 80. The step of determining frequency and duration of undesired variations preferably includes comparing a voltage signal to a predetermined voltage threshold value and determining a time period that the voltage signal is above or below the predetermined voltage threshold value. Further, the methods preferably also includes measuring power usage of a power customer responsive to an electrical signal representative of a customer load, and communicating a signal representative of the amount of power used responsive to a command signal received from a power generator. The power usage also may then be controlled responsive to predetermined command signals received from a power customer.

By providing power quality and power usage measurement, as well as other beneficial functions such as energy management control 90, in a revenue accuracy meter, the meter 40, and associated methods, of the present invention provides a compact and relatively inexpensive solution to problems associated with prior devices and systems. Additionally, the data communications capabilities of a revenue accuracy meter 40 of the invention enhances a power generator's capability to monitor power quality situations at specific customer sites, i.e., including problems in the secondary power distribution system 36, remote from the power generating stations 21 or SCADA control facilities 22. These problems, for example, may include harmonic distortion, spikes, surges or sags, blackouts, brownouts, or other distribution system problems that greatly affect the quality of power received by the power customer 60 at its industrial/commercial facility 41 or residence 42.

In the drawings and specification, there have been disclosed typical preferred embodiments of a revenue accuracy meter 40, and associated methods, according to the invention and, although specific terms are employed, they are used in a descriptive sense only and not for purposes of limitation. The invention has been described in considerable detail with specific reference to these various illustrated embodiments. It will be apparent, however, that various modifications and changes can be made within the spirit and scope of the invention as described in the foregoing specification and as defined in the appended claims.

That which is claimed:

1. In an electrical energy meter containing means therein for metering a quantity of electrical energy generated by a supplier and transferred via a power supply line to a load of a customer during an energy measurement time interval, a method of monitoring variations in the metered quantity of electrical energy, comprising the steps of:

sensing a line voltage transferred via the power supply line to the load during the energy measurement time interval;

detecting an increase in a magnitude of the sensed line voltage from an acceptable voltage level to a level greater than a first surge threshold voltage, upon commencement of a surge time interval during which the magnitude of the sensed line voltage is at all times greater than the acceptable voltage level;

recording a surge event if the magnitude of the sensed line voltage exceeds the acceptable voltage level for a first predetermined amount of time after commencement of the surge time interval; and then communicating the recorded surge event to at least the supplier or customer before termination of the surge time interval.

2. The method of claim 1, further comprising the steps of capturing the sensed line voltage as a waveform during the surge time interval; and communicating the waveform to the supplier before termination of the surge time interval.

3. The method of claim 1, wherein said detecting step comprises detecting an increase in a magnitude of the sensed line voltage from an acceptable voltage level to a level greater than a first surge threshold voltage, upon commencement of a surge time interval during which the magnitude of the sensed line voltage is at all times greater than at least a second surge threshold voltage intermediate the acceptable voltage level and the first surge threshold voltage.

4. The method of claim 1, wherein said communicating step comprises transferring data from a modem internal to the meter to a telephone line operatively connected thereto via a data port.

5. The method of claim 4, further comprising the steps of capturing the sensed line voltage as a waveform during the surge time interval; and communicating the waveform to the supplier before termination of the surge time interval.

6. The method of claim 1, further comprising the steps of:

detecting a decrease in the magnitude of the sensed line voltage from the acceptable voltage level to a level less than a first sag threshold voltage, upon commencement of a sag time interval during which the magnitude of the sensed line voltage is at all times less than the acceptable voltage level;

recording a sag event if the magnitude of the sensed line voltage stays below the acceptable voltage level for a second predetermined amount of time after commencement of the sag time interval; and then communicating the recorded sag event to at least the supplier or customer before termination of the sag time interval.

7. The method of claim 6, wherein said step of detecting an increase comprises detecting an increase in a magnitude of the sensed line voltage from an acceptable voltage level to a level greater than a first surge threshold voltage, upon commencement of a surge time interval during which the magnitude of the sensed line voltage is at all times greater than at least a second surge threshold voltage intermediate the acceptable voltage level and the first surge threshold voltage; and wherein said step of detecting a decrease comprises detecting a decrease in the magnitude of the sensed line voltage from the acceptable voltage level to a level less than a first sag threshold voltage, upon commencement of a sag time interval during which the magnitude of the sensed line voltage is at all times less than a second sag threshold voltage intermediate the acceptable voltage level and the first sag threshold voltage.

8. The method of claim 7, wherein said step of recording a surge event comprises recording a surge event if the sensed line voltage exceeds the second surge threshold voltage for a first predetermined amount of time after commencement of the surge time interval.

9. In an electrical energy meter containing means therein for metering a quantity of electrical energy generated by a supplier and transferred via a power supply line to a load of a customer during an energy measurement time interval, a method of monitoring variations in the metered quantity of electrical energy, comprising the steps of:

sensing a line voltage transferred via the power supply line to the load during the energy measurement time interval;

detecting an increase in a magnitude of the sensed line voltage from an acceptable voltage level to a level greater than a first surge threshold voltage, upon commencement of a surge time interval during which the magnitude of the sensed line voltage is at all times greater than the acceptable voltage level;

recording a surge event if the magnitude of the sensed line voltage exceeds the acceptable voltage level for a first predetermined amount of time after commencement of the surge time interval; and then communicating the recorded surge event to at least the supplier or customer promptly on a real time basis.

10. The method of claim 9, further comprising the steps of:

detecting a decrease in the magnitude of the sensed line voltage from the acceptable voltage level to a level less than a first sag threshold voltage, upon commencement of a sag time interval during which the magnitude of the sensed line voltage is at all times less than the acceptable voltage level;

recording a sag event if the magnitude of the sensed line voltage stays below the acceptable voltage level for a second predetermined amount of time after commencement of the sag time interval; and then communicating the recorded sag event to at least the supplier or customer promptly on a real time basis.

11. An electrical energy meter for reporting line voltage variations in real-time, comprising:

means for sensing a line voltage generated by a supplier and transferred via a power supply line to a load of a customer;

means, responsive to said sensing means, for detecting an increase in a magnitude of the sensed line voltage from an acceptable voltage level to a level greater than a first surge threshold voltage, upon commencement of a surge time interval during which the magnitude of the sensed line voltage is at all times greater than the acceptable voltage level;

means, responsive to said detecting means, for recording a surge event if the sensed line voltage exceeds the acceptable voltage level for a first predetermined amount of time after commencement of the surge time interval; and means, responsive to said recording means, for communicating the recorded surge event to at least the supplier or customer before termination of the surge time interval.

12. The meter of claim 11, further comprising:

means, responsive to said sensing means, for detecting a decrease in the magnitude of the sensed line voltage from the acceptable voltage level to a level less than a first sag threshold voltage, upon commencement of a sag time interval during which the magnitude of the sensed line voltage is at all times less than the acceptable voltage level;

means, responsive to said means for detecting a decrease, for recording a sag event if the sensed line voltage stays below the acceptable voltage level for a second predetermined amount of time after commencement of the sag time interval; and means, responsive to said means for recording a sag event, for communicating the recorded sag event to at least the supplier or customer before termination of the sag time interval.

13. The meter of claim 12, wherein said means for communicating the recorded surge event comprises a modem for transferring data from internal the meter to an external telephone line via a data port.

14. The meter of claim 13, wherein said means for recording a surge event comprises means for capturing the sensed line voltage as a waveform during the surge time interval; and wherein said means for communicating the recorded surge event comprises means for communicating the waveform to the supplier before termination of the surge time interval.

* * * * *